United States Patent [19]

Rosbeck

[11] Patent Number: 4,751,560

[45] Date of Patent: Jun. 14, 1988

[54] INFRARED PHOTODIODE ARRAY

[75] Inventor: Joseph P. Rosbeck, Goleta, Calif.

[73] Assignee: Santa Barbara Research Center, Goleta, Calif.

[21] Appl. No.: 832,111

[22] Filed: Feb. 24, 1986

[51] Int. Cl.$^4$ ............................................. H01L 27/14
[52] U.S. Cl. ...................................... 357/32; 357/30; 357/53
[58] Field of Search .................... 357/13, 13 U, 30 H, 357/53, 32, 31, 45, 30 D, 30 L, 30 Q, 24 LR

[56] References Cited

U.S. PATENT DOCUMENTS

| | | | |
|---|---|---|---|
| 3,339,086 | 8/1967 | Shockley | 357/13 X |
| 3,573,571 | 4/1971 | Brown et al. | 357/53 X |
| 4,127,932 | 12/1978 | Hartman et al. | 357/13 X |
| 4,415,370 | 11/1983 | Kagawa et al. | 357/13 |
| 4,646,120 | 2/1987 | Hacskaylo | 357/32 X |

FOREIGN PATENT DOCUMENTS 2139000 10/1984 United Kingdom .................. 357/31

OTHER PUBLICATIONS

Sood, A. K., and Tobin, S. P., "Improved Performance of Implanted n+-P HgCdTe Photodiodes . . . ", IEEE Elec. Dev. Lett., vol. EDL-1, No. 1, Jan. 1980, pp. 12–14.

Sze, S. M., Physics of Semiconductor Devices, John Wiley, 1981, pp. 414 and 416.

Primary Examiner—Andrew J. James
Assistant Examiner—Sara W. Crane
Attorney, Agent, or Firm—W. C. Schubert; V. G. Laslo; A. W. Karambelas

[57] ABSTRACT

A mercury-cadmium-telluride photodiode array detector having a composite structure which includes a p-type HgCdTe substrate, a surface of which is implanted with n-type regions, thereby forming individual photodiodes of the array. Overlying this surface is a layer of insulating dielectric containing a buried layer of guard plate metalization. Overlying the dielectric is a layer of field plate metalization. Openings made through the field plate, dielectric, and guard plate allow for electrical contact with the individual photodiodes. The openings within the guard plate are made larger than those within the field plate. When these two plates are appropriately biased by external voltage sources, the substrate surface underlying the field plate and surrounding each diode is made to invert. The substrate surface underlying the guard plate remains at flat band potential, thereby electrically isolating the inverted surface surrounding each diode from the other inverted surfaces.

8 Claims, 1 Drawing Sheet

INFRARED PHOTODIODE ARRAY

BACKGROUND OF THE INVENTION

This invention relates to infrared photodiode imaging array detectors and, more particularly, to a mercury - cadmium - telluride photodiode array detector having a composite structure of two overlapping metallization layers wherein the layers have openings of different sizes to enable selective areas of the HgCdTe substrate surface to undergo inversion.

An infrared photo diode imaging array converts incident infrared radiation to an electrical current. The magnitude of the current generated by each of the diodes in the array bears a direct relationship to the flux density of the infrared radiation impinging on the infrared detecting diode.

The conversion efficiency of the individual diode elements in an imaging array is a function of the area of the p-n junction which comprises the diode. As the surface area of the n-type material in contact with the p-type material increases so does the conversion efficiency. However, a problem arises in that increasing the area of the n-type region also increases the amount of thermal leakage current, or dark current, generated by the diode, with a consequent reduction in the diode signal-to-noise ratio. This results in a degradation of the overall image seen by the array of diodes.

The n-type regions within the diode array are formed typically by ion implantation techniques, wherein a suitable n-type material is implanted by a stream of particles directed into the crystalline lattice of a p-type substrate. This implantation process by its nature, however, introduces a problem in that the material implanted within the substrate may cause damage to the crystalline lattice thereof. One result of this damage may be a further increase in the thermally induced diode leakage current.

SUMMARY OF THE INVENTION

The foregoing problems are overcome and other advantages are provided by a photodiode imaging array which, in accordance with the invention, has a laminated structure of two overlapping metallization layers separated by an insulting dielectric.

In one embodiment of the invention, openings within a buried layer of appropriately biased guard metallization define areas of substrate surface surrounding n-type implant regions, which areas undergo an inversion produced by an electric field in an overlying layer of field plate metallization. This selective inversion of the substrate results in a larger effective diode p-n junction area, with a consequent increase in conversion efficiency without a corresponding decrease in the signal-to-noise ratio.

BRIEF DESCRIPTION OF THE DRAWINGS

The invention will now be described by reference to the following drawings and description in which like elements have been given common reference numbers, wherein.

DETAILED DESCRIPTION

Figure 1:
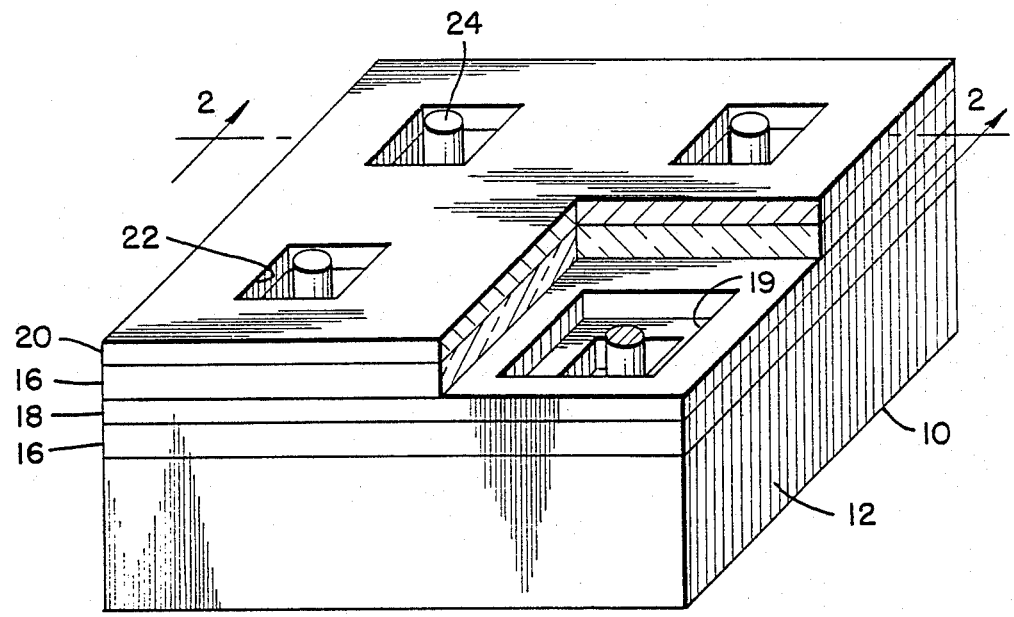
FIG. 1 is a perspective view, on exaggerated scale, showing a photodiode imaging array having an inversion field plate metallization and a guard field plate metallization in accordance with an embodiment of the invention, a portion of the array having been cut away to expose the guard field plate metallization layer.
Figure 2:
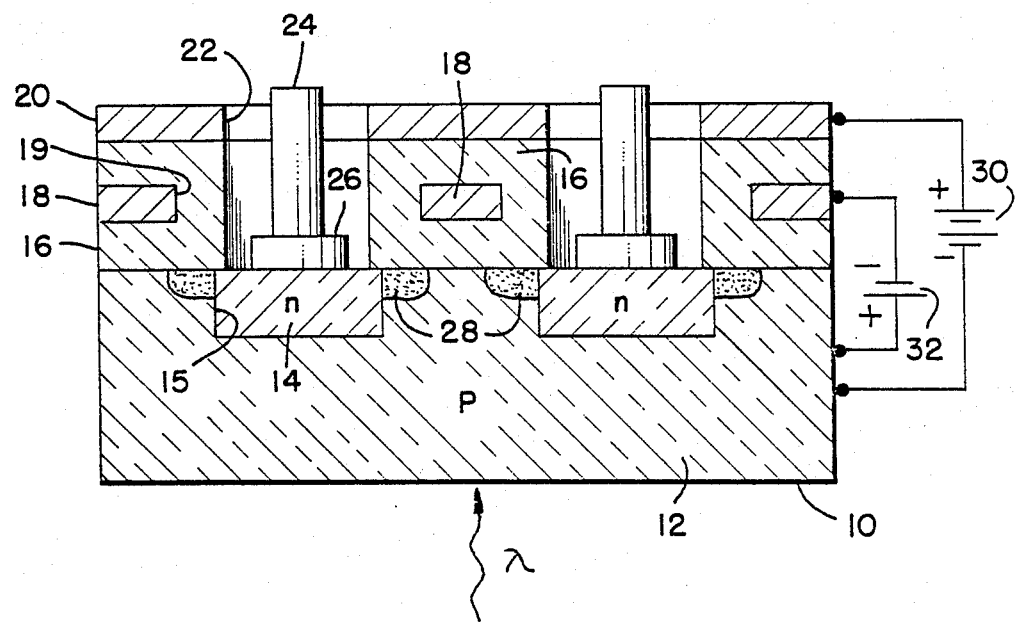
FIG. 2 is a side view of the photodiode imaging array taken in section along line 2—2 of FIG. 1.

With reference to FIGS. 1 and 2 there is shown an exemplary photodiode array assembly 10. A substrate 12 composed of mercury - cadmium - telluride is doped with a material such as arsenic suitable to give substrate 12 the characteristics of a p-type semiconductor material. Typically, the concentration of arsenic within substrate 12 is $5 \times 10^{15}$ atoms per cubic centimeter of substrate material. The substrate 12 has a typical thickness of 10 microns. Within the upper surface of the substrate 12 are formed a plurality of n-type well regions 14. The well regions 14 are formed by the ionic implantation of a material such as boron suitable to create an n-type region. The concentration of boron must be sufficient to overcome the effect of the arsenic within substrate 12, the concentration of boron being typically $10^{17}$ atoms per cubic centimeter. The depth of the n-type implant regions 14 is typically 1 micron. The spacing between the implant regions 14 is typically 100 microns.

At the interface of the substrate 12 and a region 14 is formed the p-n junction defining a diode 15. The number of diodes 15 within the photodiode array is determined by the number of regions 14 implanted within the substrate 12. While FIG. 1 shows an array of four such diodes 15, it is understood that a typical two dimensional photodiode array might contain, for example, an array of ten by ten diodes, or 100 in total.

Also, while the implant regions 14 of FIG. 1 are shown to be of a square shape, the regions 14 could also be circular. If a square shape is employed each side of the square would typically be 60 microns in length. Likewise, if a circular shape is employed, the diameter of the regions 14 would typically be 60 microns.

Overlying the upper surface of substrate 12, within which surface the regions 14 have been implanted, is an insulating layer 16 of dielectric composed typically of silicon dioxide or zinc sulfide. The insulating layer 16 is formed by a chemical vapor deposition process after the regions 14 have been suitably masked to prevent the deposition of dielectric upon their surfaces.

The layer 16 of dielectric is grown to a thickness providing desired insulating properties. Thereupon, the chemical vapor deposition process is halted and a thin layer 18, typically a few hundred angstroms, of metallization is deposited over the surface of the dielectric layer 16. The dielectric layer 16 is first suitably masked to provide openings 19 within the metallization of the layer 18. The layer 18 of metallization, typically composed of titanium, serves as a guard plate. As shown in the Figures, the plurality of openings 19 within the layer 18 of guard plate metallization are of a larger area than the openings within the layer of underlaying dielectric, and are also of a larger area than the underlying regions 14. That these guard plate metallization openings 19 are of a greater area than the area of the regions 14 is an important feature of this embodiment of the invention, as will be discussed.

After the layer 18 of guard plate metallization is deposited, the layer 16 of insulating dielectric is further built up by a chemical vapor deposition process to an overall typical thickness of 1000 angstroms. It can be seen by reference to the Figures that the layer 18 of guard plate metallization is contained within the layer 16 of dielectric when the process of dielectric deposition is complete.

Overlying the dielectric layer 16 is deposited an upper layer 20 of metallization. The layer 20 of metallization serves as a field plate and is also composed of a metal such as titanium deposited to a thickness of a few hundred angstroms. However, the layer 20 of field plate metallization is deposited over the entire upper surface of the dielectric layer, the layer 20 having openings 22 in registration with the plurality of openings in the dielectric layer 16.

The Figures further show that the area of the openings 22 within the field plate layer 20 are slightly smaller than the area of the underlying regions 14, and are therefore of lesser area than the aforementioned openings 19 within the guard plate layer 18. This inequality of opening areas between the field plate layer 20 and the guard plate layer 18 permits the development of an inversion layer in the surface of the p-type substrate 12 laterally adjacent to the regions 14, which surface region underlies only the field plate layer 20 but not the guard plate layer 18. This is an important feature of the invention.

Referring now to FIG. 2, when infrared radiation of a wavelength which can be detected impinges on the lower surface of substrate 12, a diode electric current is induces to flow across the p-n junction where the region 14 is in intimate contact with the surrounding substrate 12. The electric current is conducted away to a suitable detecting means (not shown) by a plurality of diode contacts 24. The diode contacts 24 are typically composed of a metal such as indium, and are mounted on an interface layer 26. The interface layer 26 is typically a layer of palladium deposited upon the surface of a region 14.

To make electrical connection with the plurality of diode contacts 24 individual wires may be connected. However, this would create a complex mechanical situation because of the small size of the contacts and the close spacing between them. Preferably, a second semiconductor device (not shown) would sit atop the diode array, the second device have a plurality of contacts positioned in registration with the plurality of diode contacts 24 for electrical connection therewith.

The second device is, typically, a multiplexer (not shown) which allows for scanning the signals of the respective diodes 15. In the use of such a multiplexer, there may be a reverse bias applied to each of the diodes 15, this reverse bias having a magnitude of a fraction of a volt.

As has been previously stated, an important feature of this invention is the creation of an inversion layer 28 within the surface of the p-type substrate 12 surrounding each of the n-type implant regions 14. The inversion layer 28 operates electrically to fill up the surface energy states of the substrate 12 with electrons. This results in the reduction of the leakage, or thermal, current thereby improving the uniformity of array 10. A further beneficial result of this reduction in leakage current is that the signal-to-noise ratio of array assembly 10 is increased, with a corresponding enhancement of image quality. There are still further advantages to be gained from the use of this inversion layer 28. By filling the surface energy states of substrate 12 with electrons, an n-type layer is created within the surface of substrate 12. This n-type layer effectively enlarges the area of the n-type regions 14, resulting in a larger p-n diode junction and hence, an increased conversion efficiency of infrared radiation to electrical current. A further advantage to be gained from the creation of this inversion layer 28 is that the reverse breakdown voltage of each diode 15 is increased, thereby preventing image degradation which might result from the application of a reverse bias by a multiplexer which might be connected to the photodiode array 10. Still a further advantage to be gained is that there is a reduction in the amount of dark current which flows when no radiation is present. This reduction in dark current results because the fractional area of the n-type diode junction produced by the ion implant is reduced. Thus, the aforementioned thermal leakage current induced by the implant damage is minimized.

To create this inversion layer 28 surrounding each diode 15 the positive terminal of a first battery 30 is connected to the inversion field plate 20, and the negative terminal of the battery 30 is connected to the substrate 12. The voltage of the battery 30 is typically three volts. The negative terminal of a second battery 32 is connected to the guard plate 18, and the positive terminal of the battery 32 is conncted to the substrate 12. The voltage of the battery 32 is typically one-half volt.

The positive electric field created by the application of the battery 30 to the field plate layer 20 acts to attract free electrons within substrate 12 to the upper surface of the substrate 12, thereby creating an inversion layer 28 within the upper surface.

The negative electric field created by guard plate layer 18 and battery 32 acts to cancel the positive electric field created by the overlying field plate layer 20, thereby holding the surface of substrate 12 underlying the guard plate layer 18 at flat band potential. Since no free electrons are drawn to the surface of substrate 12 underlying the guard plate 18, this surface does not invert, and therefore remains as p-type material.

This is an important feature of this invention, in that absent the electric field within the guard plate layer 18 the entire surface of substrate 12 would undergo inversion. This would effectively electrically connect all of the regions 14, rendering the device unuseable as an imaging diode array detector.

The use of the guard plate 18 therefore serves to allow the creation of well defined inversion layers 28 surrounding each of the n-type regions 14, resulting in an infrared photodiode array detector with the many advantages described beforehand.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. An assembly of photodiodes disposed in an array on a common substrate for the conversion of incident radiation to electric signals, each of said photodiodes comprising a p-n junction formed alongside a first surface of said substrate, said first surface being opposite a second surface for reception of the incident radiation, said assembly further comprising:
   a first electrically conducting layer disposed parallel to said first surface;
   a layer of dielectric material disposed upon said first surface and supporting said first layer;
   a second electrically conducting layer formed within said dielectric layer and disposed parallel to said first surface, said dielectric layer insulating said second layer from said first layer and from said substrate, said first and said second electrically conducting layers each having openings disposed in registration with respective ones of said photodiodes; and wherein said substrate is doped to provide electrical charge carriers;

said first electrically conducting layer, upon energization from a source of electric potential, inducing an inversion layer in said first surface of said substrate around each of said photodiodes, the openings in said first layer being smaller than the corresponding openings in said second layer for defining an inner boundary of the inversion layer about each of said photodiodes; and said second electrically conducting layer, upon energization by a source of electric potential, terminating the extent of the inversion layer about each of said photodiodes, the openings of said second layer defining the outer boundaries of the inversion layer about each of said photodiodes, the inversion layer about each of said photodiodes increasing the capacity of each of said photodiodes for converting incident radiation to an electrical signal.

2. An assembly of photodiodes according to claim 1 wherein said substrate is doped with p-type material and each of said photodiodes comprises a region formed within said substrate and doped with n-type material, and wherein the inversion layer at each of said photodiodes contacts said n-type region and induces n-type charge carriers along said first surface of said substrate in the inversion layer.

3. An assembly of photodiodes according to claim 2 wherein each of said photodiodes is provided with a contact upstanding through a corresponding opening of said first electrically conducting layer, said contacts in respective ones of said photodiodes permitting connection between said photodiodes and an external electrical circuit.

4. A semiconductor photodiode imaging array comprising:

a photoresponsive p-type semiconductor substrate of mercury-cadmium-telluride for receiving infrared radiation along a lower surface;

a plurality of diodes disposed along an upper surface of said substrate, each of said diodes comprising an n-type semiconductor region forming a junction with said substrate;

a layer of insulating dielectric material overlying said substrate surface;

a plurality of openings in said layer of dielectric material exposing portions of respective ones of said n-type regions;

a first electrically conductive layer overlying said layer of dielectric material;

a plurality of diode contacts connected to exposed portions of said n-type regions and respective ones of said diodes; and a second electrically conductive layer disposed within said layer of dielectric material between said overlying first layer and said underlying substrate, said second layer having a plurality of openings in registration with said openings within said dielectric layer and of greater area than said openings.

5. A semiconductor photodiode imaging array as defined in claim 4 wherein said first layer is biased upon connection with a positive source of voltage such that an n-type inversion layer is created within the underlying surface of said p-type substrate.

6. A semiconductor photodiode imaging array as defined in claim 5 wherein said second layer is biased upon connection with a negative source of voltage such that the surface of said substrate underlying said second layer is held at flat band potential.

7. A semiconductor photodiode imaging array as defined in claim 6 wherein said second layer is interposed between said first layer and said underlying substrate such that an n-type inversion layer is created within said substrate surface connecting with a surrounding each of the plurality of said n-type regions.

8. A semiconductor photodiode imaging array as defined in claim 7 wherein the said inversion layer connecting with and surrounding each one of said n-type regions enlarges the area of each of said n-type regions; and wherein the said diode junctions formed by said n-type regions and said substrate are thereby enlarged.

* * * * *